United States Patent
Chen et al.

(10) Patent No.: US 9,911,707 B2
(45) Date of Patent: Mar. 6, 2018

(54) STRUCTURE AND METHOD OF FORMING A PAD STRUCTURE HAVING ENHANCED RELIABILITY

(71) Applicant: TAIWAN SEMICONDUCTOR MANUFACTURING COMPANY, LTD., Hsinchu (TW)

(72) Inventors: Hsien-Wei Chen, Sinying (TW); Ying-Ju Chen, Tuku Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 496 days.

(21) Appl. No.: 14/253,170

(22) Filed: Apr. 15, 2014

(65) Prior Publication Data
US 2014/0225253 A1     Aug. 14, 2014

Related U.S. Application Data

(62) Division of application No. 12/762,558, filed on Apr. 19, 2010, now Pat. No. 8,723,325.

(60) Provisional application No. 61/175,984, filed on May 6, 2009.

(51) Int. Cl.
    *H01L 23/00*     (2006.01)
    *H01L 21/768*    (2006.01)
    *H01L 23/532*    (2006.01)

(52) U.S. Cl.
    CPC .............. *H01L 24/13* (2013.01); *H01L 24/03* (2013.01); *H01L 24/05* (2013.01); *H01L 24/11* (2013.01); *H01L 21/76807* (2013.01); *H01L 23/5329* (2013.01); *H01L 2224/0345* (2013.01); *H01L 2224/03462* (2013.01); *H01L 2224/03464* (2013.01); *H01L 2224/0401* (2013.01);
    (Continued)

(58) Field of Classification Search
    CPC ..... H01L 2224/05147; H01L 21/76807; H01L 2224/05006; H01L 24/13; H01L 2924/3512; H01L 23/5329; H01L 24/03; H01L 24/05; H01L 24/11
    See application file for complete search history.

(56) References Cited

U.S. PATENT DOCUMENTS 5,840,625 A * 11/1998 Feldner ............ H01L 21/76807
                                                257/E21.579
6,734,090 B2   5/2004 Agarwala et al.
(Continued)

*Primary Examiner* — Tom Thomas
*Assistant Examiner* — Benjamin Tzu-Hung Liu
(74) *Attorney, Agent, or Firm* — Hauptman Ham, LLP

(57) ABSTRACT

An integrated circuit structure includes a substrate, and a first metal layer over the substrate. The integrated circuit structure further includes a second insulating layer over the first metal layer, the second insulating layer having a damascene opening and two via openings. The damascene opening has a first depth. The two via openings have a second depth greater than the first depth. The integrated circuit structure further includes a stress buffer having a flat upper surface extending from a first side of the stress buffer to a second side of the stress buffer, the first side and second side being parallel, the stress buffer having a thickness between the upper surface of the stress buffer and the first metal layer, the thickness being less than the second depth and greater than the first depth. The integrated circuit structure further includes a second metal layer over the stress buffer.

20 Claims, 3 Drawing Sheets

(52) U.S. Cl.
CPC ............... *H01L 2224/05006* (2013.01); *H01L 2224/05019* (2013.01); *H01L 2224/05022* (2013.01); *H01L 2224/05124* (2013.01); *H01L 2224/05147* (2013.01); *H01L 2224/05184* (2013.01); *H01L 2224/05572* (2013.01); *H01L 2224/11849* (2013.01); *H01L 2224/131* (2013.01); *H01L 2924/0002* (2013.01); *H01L 2924/00014* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01015* (2013.01); *H01L 2924/01019* (2013.01); *H01L 2924/01022* (2013.01); *H01L 2924/01024* (2013.01); *H01L 2924/01029* (2013.01); *H01L 2924/01033* (2013.01); *H01L 2924/01049* (2013.01); *H01L 2924/01073* (2013.01); *H01L 2924/01074* (2013.01); *H01L 2924/01078* (2013.01); *H01L 2924/04953* (2013.01); *H01L 2924/14* (2013.01); *H01L 2924/30105* (2013.01); *H01L 2924/3512* (2013.01)

(56) References Cited

U.S. PATENT DOCUMENTS

| | | | |
|---|---|---|---|
| 6,861,376 | B1 | 3/2005 | Chen et al. |
| 7,328,830 | B2* | 2/2008 | Bachman .......... H01L 21/02063 228/180.21 |
| 2002/0047218 | A1* | 4/2002 | Liu ..................... H01L 21/7684 257/786 |
| 2003/0232494 | A1 | 12/2003 | Adams et al. |
| 2004/0166659 | A1 | 8/2004 | Lin et al. |
| 2004/0198055 | A1 | 10/2004 | Wang |
| 2004/0266159 | A1* | 12/2004 | Gardecki ............. B23K 3/0623 438/613 |
| 2006/0006547 | A1* | 1/2006 | Matsunaga ....... H01L 21/76801 257/774 |
| 2007/0145596 | A1 | 6/2007 | Chen et al. |
| 2008/0020559 | A1* | 1/2008 | Chen ................. H01L 21/76895 438/597 |
| 2008/0272493 | A1* | 11/2008 | Ko ....................... H01L 21/563 257/760 |
| 2008/0286962 | A1* | 11/2008 | Lee .................. H01L 21/76877 438/631 |
| 2010/0001412 | A1* | 1/2010 | Chang .................. H01L 23/522 257/782 |

* cited by examiner

STRUCTURE AND METHOD OF FORMING A PAD STRUCTURE HAVING ENHANCED RELIABILITY

PRIORITY CLAIM

The present application is a divisional of U.S. application Ser. No. 12/762,558, filed Apr. 19, 2010, which claims priority of U.S. Provisional Application No. 61/175,984, filed May 6, 2009, which are incorporated herein by reference in their entireties.

BACKGROUND

The disclosure relates generally to the fabrication of semiconductor bond pad structures, and more particularly, to a structure and method of forming a bond pad structure having enhanced reliability.

Semiconductor bond pad structures having bond wires and solder bump structures using flip chip technology continue to face new challenges as semiconductor device geometries continue to decrease in size. As a consequence of device miniaturization, the RC time constant of the interconnection between active circuit elements increasingly dominates the achievable chip speed-power product. One challenge is the adoption of extreme low-k (ELK) dielectric materials for use in semiconductor bond pad structures to reduce RC delay and parasitic capacitances. ELK dielectric materials generally have dielectric constant (k) values of less than about 2.5. However, as the k values decreases, as a general rule, the strength of the dielectric material decreases and these ELK materials are mechanically much weaker than the conventional silicon dioxide layers. Hence, many ELK materials are highly susceptible to cracking or lack the strength needed to withstand some mechanical processes, such as when the bond pad structure is subjected to an application of force. For example, during wire bonding tests, the overlying bond pad receives a large bonding force causing defect formation or cracking of the underlying inter-metal dielectric (IMD) layers. These wire bonding and other bonding processes induce mechanical and temperature stress in and around the bond pad, including in the conductive and dielectric layers underlying the bond pad.

These cracks may also come about when the device is subjected to thermal cycling during manufacturing, assembly, packaging, testing, and handling. Furthermore, these cracks may propagate as a result of the differences in the coefficients of thermal expansion (CTE) between different semiconductor chip materials. These cracks and peeling of various layers under the bond pad can adversely affect device performance and reliability.

For these reasons and other reasons that will become apparent upon reading the following detailed description, there is a need for an improved bond pad structure and a method of fabrication that avoids the reliability issues associated with conventional bond pad structures. The method should be low cost and use existing manufacturing equipment so that no investment in new equipment is needed.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
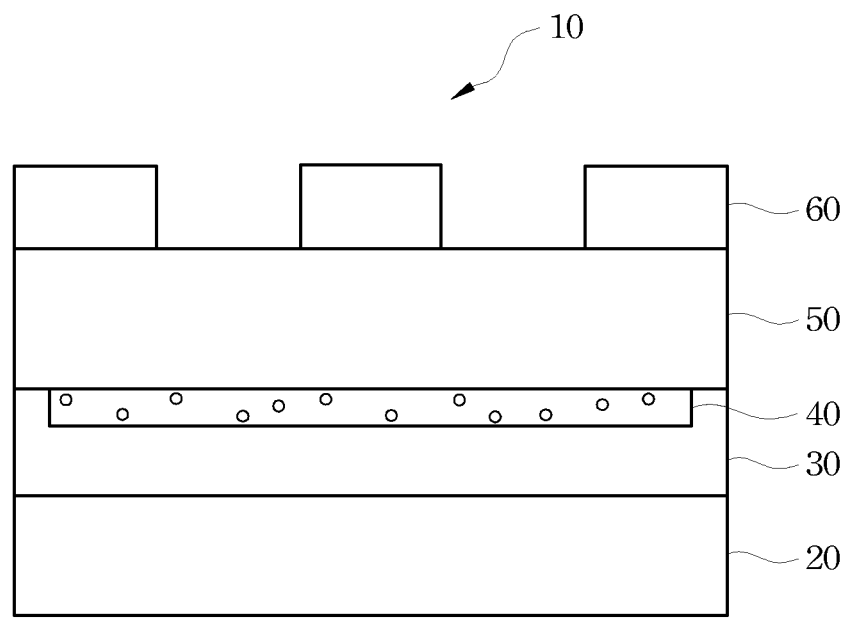
FIGS. 1-6 show cross-sectional views of a portion of a bond pad structure of a semiconductor device at various stages of manufacture according to an exemplary embodiment of the present invention.

FIG. 1 shows a cross-sectional view of a portion of a bond pad structure of a semiconductor device 10 at a stage of manufacture according to an exemplary embodiment of the present invention. The semiconductor device 10 includes a substrate 20 that may include an elementary semiconductor such as silicon, germanium, and diamond. The substrate 20 may comprise a compound semiconductor such as silicon carbide, gallium arsenic, indium arsenide, indium phosphide, or a combination of these. The substrate 20 may comprise an alloy semiconductor such as silicon germanium, silicon germanium carbide, gallium arsenic phosphide, gallium indium phosphide or a combination of these. Furthermore, the substrate 20 may comprise a semiconductor-on-insulator (SOI) structure.

As is understood by those skilled in the art, substrate 20 may include active and passive devices and various conductive layers and dielectric layers. As is shown in FIG. 1, a top metal layer or first metal layer 40 is formed over first insulating layer 30. First metal layer 40 may comprise copper, copper alloy, tungsten aluminum, or alloys thereof and is formed by conventional processes including barrier layers (not shown) lining the interface of first insulating layer 30 and first metal layer 40. First insulating layer 30 comprises a dielectric material. The dielectric material may include silicon oxide, Fluorosilicate glass (FSG), extreme low-k materials, or combinations thereof. The extreme low-k materials can be defined as a dielectric material having its dielectric constant less than about 2.5. The extreme low-k materials may comprise a silicon oxide based material having a porous structure such as carbon doped silicon oxide, organo-silicate glass (OSG), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials. The first insulating layer 30 may be formed by a Chemical Vapor Deposition (CVD) process such as, for example Low Pressure CVD (LPCVD) or Plasma Enhanced CVD (PECVD).

An etch stop layer (not shown) is then formed over portions of the first insulating layer 30 and the first metal layer 40 by conventional CVD processes, for example, LPCVD or PECVD. The etch stop layer may comprise silicon nitride (e.g., SiN, $Si_3N_4$), silicon oxynitride (SiON), silicon carbide (e.g., SiC), and other materials.

Still referring to FIG. 1, the semiconductor device 10 further comprises a second insulating layer 50 formed over first metal layer 40 and first insulating layer 30. The second insulating layer 50 is a dielectric layer that comprises a material such as for example, undoped silicate glass (USG), silicon nitride (SiN), boron doped silicate glass (BSG), phosphorous doped silicate glass (PSG), boron phosphorous doped silicate glass (BPSG), polyimides, benzocyclobutene, parylenes, diamond-like carbon, cyclotenes, fluorocarbons, methyl silsesquioxane, hydrogen silsesquioxanes, nanoporous oxides or carbon doped silicon dioxides. The second insulating layer 50 can be formed by conventional processes such as for example, CVD, Physical Vapor Deposition (PVD), or spin coating to a thickness of from about 2,000 Angstroms to about 15,000 Angstroms to allow formation of a damascene structure (e.g., dual damascene) and subsequent polishing back of the second insulating layer 50 to remove a portion of a subsequently deposited metal layer (e.g., copper/copper alloy). In other embodiments, the second insulating layer 50 can have a thickness of from about 7,000 Angstroms to about 10,000 Angstroms.

According to one embodiment of the present invention, a dual damascene structure is formed in semiconductor device 10. Dual damascene structures may be formed by several approaches, such as via-first approach, trench-first approach, buried-via approach (also called self-aligned dual-damascene), and others. According to one exemplary embodiment of the present invention, FIGS. 1-6 show the formation of a dual damascene structure in semiconductor device 10 according to a trench-first approach. It is understood by those skilled in the art, however, that the invention can be practiced by other damascene formation approaches.

Still referring to FIG. 1, a photoresist layer is coated on the semiconductor device 10 by a method such as spin-on coating. The photoresist layer is thereafter patterned to form a trench pattern by using a photomask (mask or reticle). An exemplary photolithography patterning process may also include soft baking, mask aligning, exposing pattern, post-exposure baking, resist developing, and hard baking. The photolithography patterning may also be implemented or replaced by other methods such as maskless photolithography, electron-beam writing, ion-beam writing, and molecular imprint. After development, a patterned resist layer 60 is thereafter formed as is depicted in FIG. 1.

The second insulating layer 50 is etched using the patterned resist layer 60 as a trench mask to transfer the trench pattern to the second insulating layer 50. The insulating layer 50 may be etched by dry etching using conventional dry (e.g., reactive ion etch, or RIE) etching chemistries, for instance. For example, an etching chemistry including fluorocarbons and/or perfluorocarbons together with oxygen, and optionally nitrogen, may be used in the dry etchback process.

Figure 2:
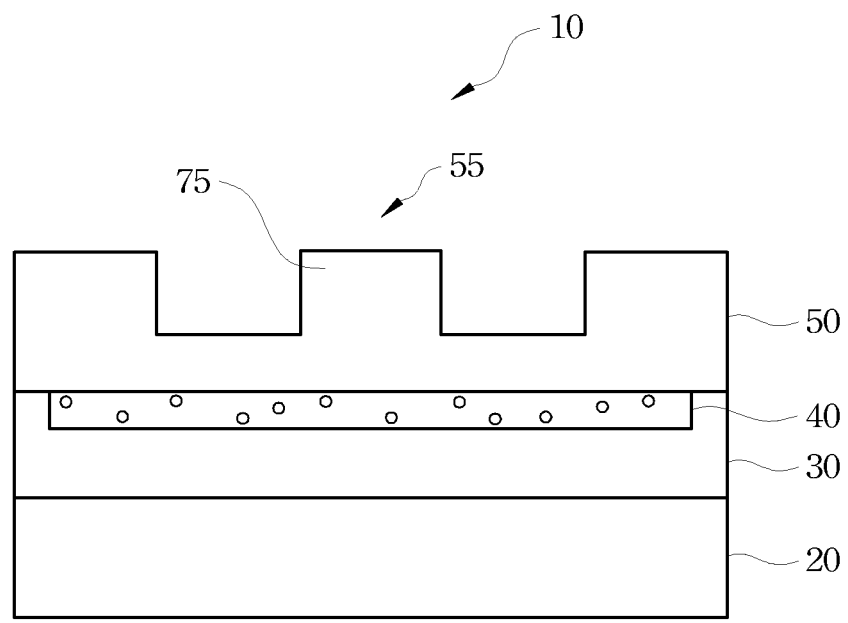

Following the removal of the patterned resist layer 60 by a conventional wet stripping and/or a dry ashing process, for example a patterned second insulating layer 50 having a first damascene opening or trench opening 55 is formed and shown in FIG. 2. In accordance with the pattern formed in the photomask, the trench opening 55 has a second insulating layer portion 75 formed therein. According to one embodiment of the present invention, the second insulating layer portion 75 is formed substantially in the middle of the trench opening 55. As will be explained further below, forming the second insulating layer portion 75 substantially in the middle of the trench opening 55 allows the second insulating layer portion 75 to better act as a stress buffer and therefore resist cracking and peeling when semiconductor device 10 undergoes bonding, manufacturing, assembling, and testing processes. In other embodiments, the second insulating layer portion 75 is formed off-center from the middle of the trench opening 55.

A second photoresist layer is deposited on patterned second insulating layer 50 to include filling the trench opening 55 and patterned to form via patterns by using a via photomask (mask or reticle) overlying the trench opening 55. The via photomask is aligned to, and adjacent to, the second insulating layer portion 75 for forming the via patterns. An exemplary photolithography patterning process may also include soft baking, mask aligning, exposing pattern, post-exposure baking, resist developing, and hard baking. The photolithography patterning may also be implemented or replaced by other proper methods such as maskless photolithography, electron-beam writing, ion-beam writing, and molecular imprint.

Figure 3:
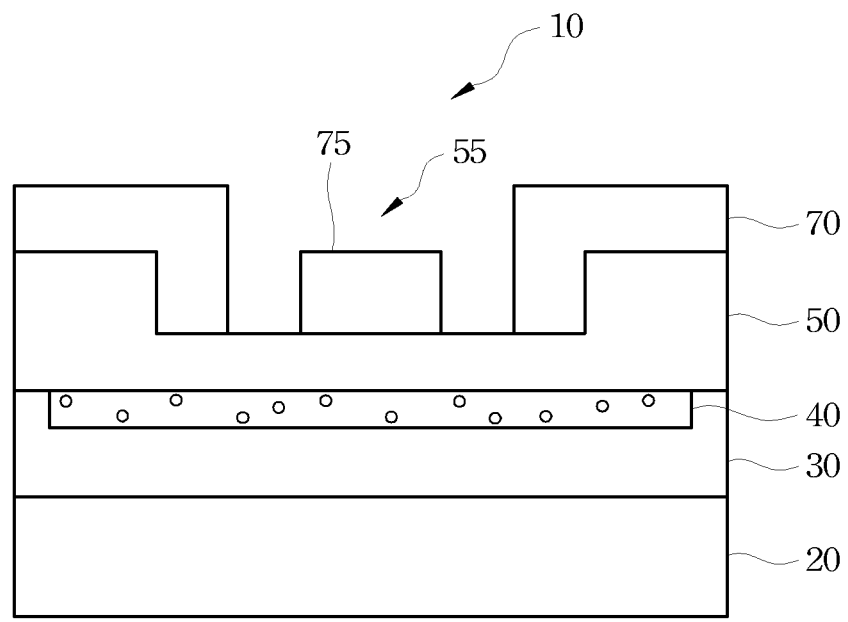

As is shown in FIG. 3, following a development step, a second patterned resist layer 70 is formed on semiconductor device 10. According to one embodiment, the second insulating layer 50 is thereafter etched using the patterned resist layer 70 as a via mask in alignment to, and adjacent to, the second insulating layer portion 75 in order to transfer the via pattern to the second insulating layer 50. The second insulating layer 50 is etched down to expose a portion of the first metal layer 40. The second insulating layer 50 may be etched by dry etching using conventional dry (e.g., RIE) etching chemistries. For example, an etching chemistry including fluorocarbons and/or perfluorocarbons together with oxygen, and optionally nitrogen, is preferably used in the dry etchback process.

Figure 4:
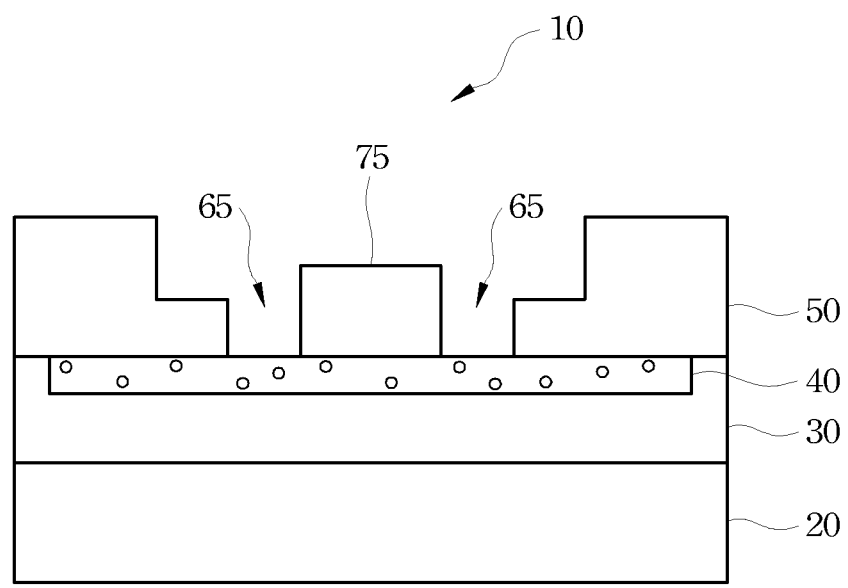

Following the removal of the second patterned resist layer 70 by a conventional wet stripping and/or a dry ashing process, a patterned second insulating layer 50 having a trench opening 55 and a second damascene opening or via opening 65 shown on either side of the second insulating layer portion 75 is formed and illustrated in FIG. 4.

Figure 5:
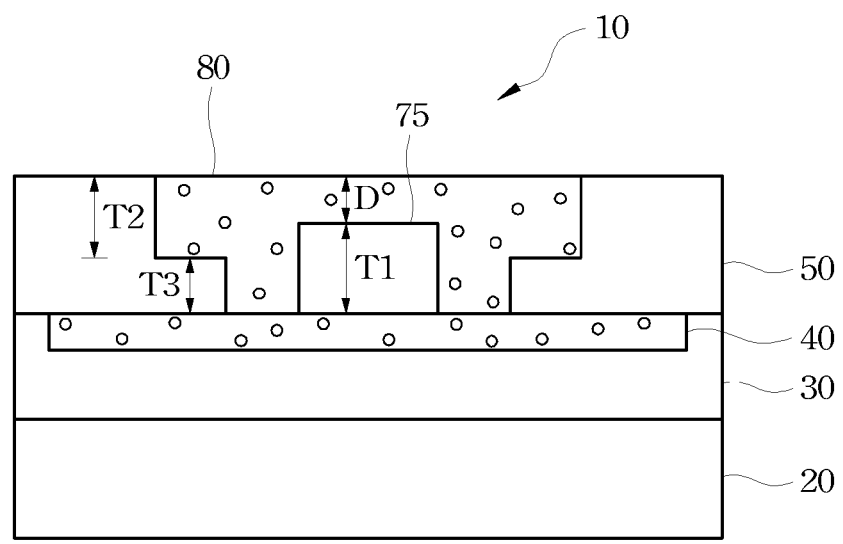

With reference now to FIG. 5, prior to depositing a copper layer to fill the damascene openings, in other words, the trench opening 55 and the via openings 65, a barrier layer (not shown) is deposited to line the damascene openings. The barrier layer may be deposited by a PECVD process and comprise a refractory metal such as, for example Ta, TaN, Ti, TiN, WN, Cr, CrN, TaSiN, TiSiN, and WSiN. Following the formation of the barrier layer, a copper seed layer (not shown) may then be deposited over the barrier layer by a PVD or CVD process, for example. A metal filling process, for example an electrochemical plating (ECP) process is then carried out to blanket deposit a second metal layer 80 to fill the damascene openings and embed the second insulating layer portion 75 in the second metal layer 80. The second metal layer 80 may comprise copper, copper alloy, tungsten aluminum, or alloys thereof. It is understood that the copper bond pad comprises the first metal layer 40 and the second metal layer 80. By embedding the second insulating layer portion 75 in a damascene structure and in the copper bond pad (first metal layer 40 and second metal layer 80), the second insulating layer portion 75 acts as a stress buffer. The semiconductor device 10 having this stress buffer is better able to withstand the stresses and thermal cycling that comes from bonding, manufacturing, assembling, packaging, handling, and testing processes and is therefore better able to resist cracks and peeling that may develop at the various layers under the bond pad.

Following copper ECP deposition, a conventional planarization process, for example Chemical Mechanical Polishing (CMP), is carried out to remove the excess portion of the second metal layer 80 above the top of the damascene trench level. In one embodiment of the present invention, following the planarization process, the thickness T1 of the second insulating layer portion 75 substantially equals the thickness T2 of the trench opening 55. This, however, does not take into account the thickness of the etch stop layer. In another embodiment, the thickness T3 of the via opening 65 equals substantially the distance D, measured from the top of the second insulating layer portion 75 to the top of the planarized second metal layer 80. In some other embodiments, the distance D is larger than the thickness T3.

Where formation of a solder bump is desired on the semiconductor device 10, the process continues from the step shown in FIG. 5. A passivation layer 90 is deposited on semiconductor device 10 above the second insulating layer 50 and the second metal layer 80. Following patterning and development by conventional photolithographic processes, passivation layer 90 has an opening formed therein exposing a portion of second metal layer 80, in other words the contact pad. Passivation layer 90 may be comprised of a material, such as undoped silicate glass (USG), silicon nitride (SiN), silicon dioxide ($SiO_2$), and silicon oxynitride (SiON). In one embodiment, passivation layer 90 has a thickness of from about 1,500 Angstroms to about 15,000 Angstroms. In other embodiments, passivation layer 90 has a thickness of from about 6,000 Angstroms to about 10,000 Angstroms. Second metal layer 80 establishes electrical contact between the electrical interconnects (not shown) in substrate 20 to a later-to-be-formed overlying solder bump.

Figure 6:
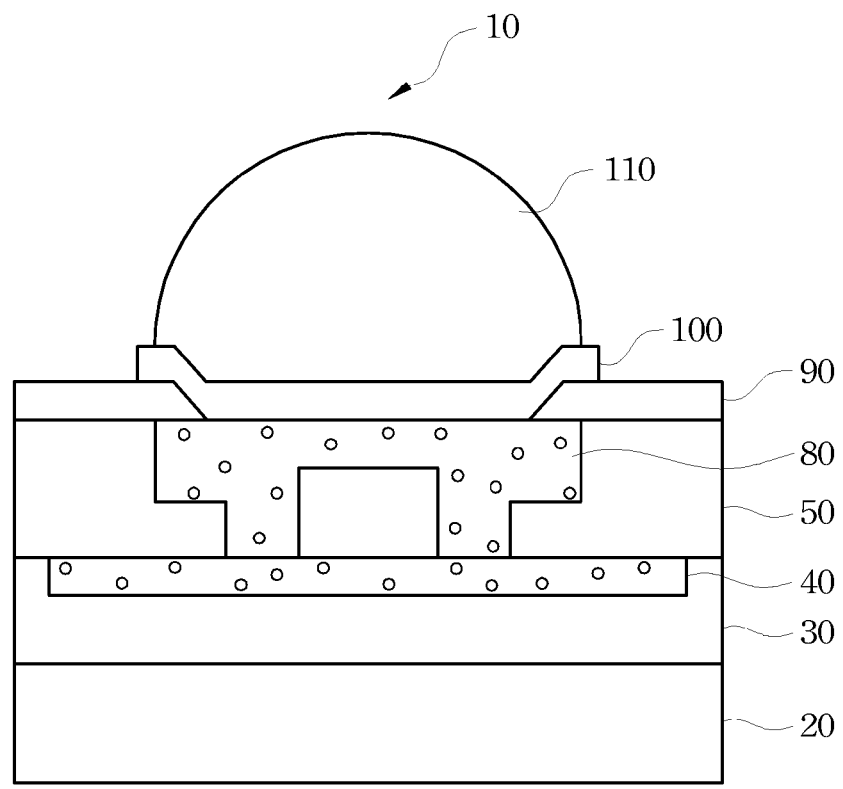

Following the formation of passivation layer 90 on substrate 20 exposing a portion of the second metal layer 80, a plurality of UBM (under bump metallurgy) layers 100 are then deposited. UBM layers 100 are deposited by methods such as sputtering, vapor deposition, electroless plating, or electroplating, over portions of the passivation layer 90 and second metal layer 80, to allow for better bonding and wetting of a later-to-be-deposited solder material to the uppermost UBM layer. Following patterning and etching by conventional photolithographic processes, the patterned and etched UBM layers 100 are shown in FIG. 6. A solder bump 110 is then formed on the UBM layers 100 by reflowing the solder material.

Where it is desired to attach the semiconductor device 10 to another microelectronic device, such as a die package, by way of a bond wire (not shown), a conductive layer (e.g., aluminum) (not shown) is formed over the passivation layer 90 and the bond wire is attached to the conductive layer. The bond wire may be bonded to the conductive layer by a bonding process, such as ultrasonic wedge bonding or the like.

An advantage of some embodiments of the present invention is that the bond pad structure can be made mechanically stronger and more robust than conventional bond pad structures using ELK dielectric layers. By embedding the USG second insulating layer portion 75 in a USG damascene structure and in the copper bond pad (first metal layer 40 and second metal layer 80), the USG second insulating layer portion 75 acts as a stress buffer. The bond pad structure having this stress buffer is better able to withstand the stresses and thermal cycling that comes from bonding, manufacturing, assembling, packaging, handling, and testing processes and is therefore better able to resist cracks and peeling that may develop at the various layers under the bond pad.

Another advantage of embodiments of the present invention is that the method of forming bond pad structures can be practiced using existing manufacturing equipment so that no investment in new equipment is needed.

One aspect of this description relates to an integrated circuit structure including a first metal layer over a substrate. The integrated circuit structure further includes a insulating layer over the first metal layer, the insulating layer having a damascene opening and two via openings. The damascene opening has a first depth with respect to an upper surface of the second insulating layer. The two via openings have a second depth with respect to the upper surface of the insulating layer, the second depth being greater than the first depth. The integrated circuit structure further includes a stress buffer having a flat upper surface extending from a first side of the stress buffer to a second side of the stress buffer, the first side and second side being parallel, the stress buffer having a thickness between the upper surface of the stress buffer and the first metal layer, the thickness being less than the second depth and greater than the first depth. The integrated circuit structure further includes a second metal layer over the stress buffer.

Another aspect of this description relates to an integrated circuit structure including a first metal layer over a substrate. The integrated circuit structure further includes an insulating layer over the first metal layer. The insulating layer defines a damascene opening including at least one via opening and a trench opening. The trench opening includes a protrusion extending beyond a sidewall of the at least one via opening, and a portion of the insulating layer is between the protrusion and the first metal layer. The integrated circuit structure further includes a second metal layer in the damascene opening. The integrated circuit structure further includes a stress buffer between a portion of the second metal layer and the first metal layer, wherein a material of the stress buffer is a same material as the insulating layer.

Still another aspect of this description relates to an integrated circuit structure including a first metal layer in a first insulating layer. The integrated circuit structure further includes a second insulating layer over the substrate, the second insulating layer defining a damascene opening therein exposing a portion of the first metal layer. The damascene opening includes a trench opening and a via opening. A portion of the second insulating layer is within the damascene opening, the portion of the second insulating layer comprises a constant width, and the portion of the second insulating layer extends through the via opening into the trench opening. The integrated circuit structure further includes a second metal layer filling the damascene opening. The integrated circuit structure further includes a passivation layer over the second insulating layer and the second metal layer, wherein the passivation layer partially covers the second metal layer.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. An integrated circuit structure, comprising:
   a first metal layer over a substrate;
   an insulating layer over the first metal layer, the insulating layer having a damascene opening and two via openings, the damascene opening having a first depth with respect to an upper surface of the insulating layer, the two via openings having a second depth with respect to the upper surface of the insulating layer, the second depth being greater than the first depth, and vias in both of the two via openings land on the first metal layer;
   a stress buffer having a flat upper surface extending from a first side of the stress buffer to a second side of the stress buffer, the first side and second side being parallel, wherein a distance from the flat upper surface of the stress buffer layer to the upper surface of the insulating layer is less than the first depth; and
   a second metal layer over the stress buffer, wherein the second metal layer has a substantially uniform composition, a thickness of the second metal layer over the stress buffer is less than the first depth, the second metal layer extends into the two via openings, and a width of the second metal layer in a first via opening of the two via openings is substantially constant along an entirety of the second depth.

2. The integrated circuit structure of claim 1, wherein a top surface of the second metal layer is substantially coplanar with the upper surface of the insulating layer.

3. The integrated circuit structure of claim 1, wherein a first via opening of the two via openings is on a first side of the stress buffer, and a second via opening of the two via openings is on a second side of the stress buffer opposite the first side.

4. The integrated circuit structure of claim 1, wherein the damascene opening has a width greater than a width of the stress buffer.

5. The integrated circuit structure of claim 1, further comprising a passivation layer over the insulating layer.

6. The integrated circuit structure of claim 5, further comprising a bump opening in the passivation layer exposing a portion of the second metal layer.

7. The integrated circuit structure of claim 6, further comprising an under bump metallurgy (UBM) layer in the bump opening.

8. The integrated circuit structure of claim 7, further comprising a solder bump in electrical contact with the UBM layer.

9. An integrated circuit structure, comprising:
   a first metal layer over a substrate, wherein the first metal layer has a first width in a direction parallel to a top surface of the substrate;
   an insulating layer over the first metal layer, the insulating layer defining a damascene opening comprising at least one via opening and a trench opening, wherein the trench opening comprises a protrusion extending beyond a sidewall of the at least one via opening, and a portion of the insulating layer is between the protrusion and the first metal layer;
   a second metal layer in the damascene opening, wherein the second metal layer has a maximum width in the direction parallel to the top surface of the substrate, the first width is greater than the maximum width; the second metal layer has a substantially uniform composition, and a maximum depth of the second metal layer at a periphery of the via opening is substantially equal to a maximum depth of the second metal layer at a center of the via opening; and
   a stress buffer between a portion of the second metal layer and the first metal layer, wherein a first thickness of the portion of the second metal layer from a top surface of the insulating layer is less than a second thickness of the second metal layer in the protrusion from the top surface of the insulating layer, wherein a material of the stress buffer is a same material as the insulating layer.

10. The integrated circuit structure of claim 9, wherein a thickness of the second metal layer in the protrusion is substantially equal to a thickness of the portion of the insulating layer between the protrusion and the first metal layer.

11. The integrated circuit structure of claim 9, wherein a thickness of the second metal layer above the stress buffer is substantially equal to a thickness of the stress buffer.

12. The integrated circuit structure of claim 9, wherein a thickness of the second metal layer above the stress buffer is greater than a thickness of the stress buffer.

13. The integrated circuit structure of claim 9, wherein the at least one via opening comprises:
   a first via opening on a first side of the stress buffer; and
   a second via opening on a second side of the stress buffer opposite the first side.

14. The integrated circuit structure of claim 9, further comprising an additional insulating layer over the substrate, wherein the first metal layer is embedded in the additional insulating layer.

15. The integrated circuit structure of claim 9, wherein the second metal layer extends a first distance beyond the stress buffer layer in a first direction parallel to a top surface of the insulating layer, and the second metal layer extends a second distance beyond the stress buffer layer in a second direction parallel to the top surface of the insulating layer, and the second distance is different from the first distance.

16. The integrated circuit structure of claim 9, further comprising a passivation layer over the insulating layer.

17. The integrated circuit structure of claim 16, further comprising a bump opening in the passivation layer exposing a portion of the second metal layer.

18. The integrated circuit structure of claim 17, further comprising an under bump metallurgy (UBM) layer in the bump opening.

19. The integrated circuit structure of claim 18, further comprising a solder bump in electrical contact with the UBM layer.

20. An integrated circuit structure, comprising:
   a first metal layer in a first insulating layer;
   a second insulating layer over a substrate, the second insulating layer defining a damascene opening therein exposing a portion of the first metal layer, the damascene opening comprising:
     a trench opening; and
     a via opening,
   wherein a portion of the second insulating layer is within the damascene opening, the portion of the second insulating layer comprises a constant width, and the portion of the second insulating layer extends through the via opening into the trench opening;
   a second metal layer filling the damascene opening, wherein the second metal layer has a substantially uniform composition, a maximum depth of the second metal layer at a periphery of the via opening is substantially equal to a maximum depth of the second metal layer at a center of the via opening; and a passivation layer over the second insulating layer and the second metal layer, wherein the passivation layer partially covers the second metal layer.

\* \* \* \* \*